United States Patent
Koehnlein

(10) Patent No.: US 11,099,681 B2
(45) Date of Patent: Aug. 24, 2021

(54) TOUCH-SENSITIVE OPERATING ELEMENT

(71) Applicant: BCS AUTOMOTIVE INTERFACE SOLUTIONS GMBH, Radolfzell (DE)

(72) Inventor: Harald Koehnlein, Radolfzell (DE)

(73) Assignee: BCS AUTOMOTIVE INTERFACE SOLUTIONS GMBH, Radolfzell (DE)

( * ) Notice: Subject to any disclaimer, the term of this patent is extended or adjusted under 35 U.S.C. 154(b) by 199 days.

(21) Appl. No.: 16/351,783

(22) Filed: Mar. 13, 2019

(65) Prior Publication Data

US 2019/0286274 A1    Sep. 19, 2019

(30) Foreign Application Priority Data

Mar. 14, 2018 (DE) .................. 102018105927.2

(51) Int. Cl.
*G06F 3/041* (2006.01)
*B60K 35/00* (2006.01)
*G06F 3/0488* (2013.01)
*G06F 3/042* (2006.01)

(52) U.S. Cl.
CPC ............ *G06F 3/0416* (2013.01); *B60K 35/00* (2013.01); *G06F 3/0421* (2013.01); *G06F 3/0488* (2013.01)

(58) Field of Classification Search
CPC ..... G06F 3/0416; G06F 3/0421; G06F 3/0488
See application file for complete search history.

(56) References Cited

U.S. PATENT DOCUMENTS

| 7,872,722 | B2* | 1/2011 | Kimura | G02F 1/136277 349/141 |
| 10,120,489 | B2 | 11/2018 | Guard et al. | |
| 10,372,247 | B2* | 8/2019 | Zhou | G06F 3/0412 |
| 10,642,392 | B2* | 5/2020 | Yoon | G06F 3/0412 |
| 10,768,766 | B2* | 9/2020 | Lee | G06F 3/045 |
| 2011/0291966 | A1* | 12/2011 | Takao | G06F 3/0446 345/173 |
| 2013/0127744 | A1* | 5/2013 | Shakya | G06F 3/0445 345/173 |
| 2013/0207911 | A1* | 8/2013 | Barton | G06F 3/044 345/173 |
| 2014/0240631 | A1* | 8/2014 | Shishido | G02F 1/136286 349/43 |
| 2014/0268292 | A1* | 9/2014 | Wang | G02B 26/023 359/290 |
| 2015/0349000 | A1* | 12/2015 | Kim | H01L 27/1255 257/57 |

(Continued)

FOREIGN PATENT DOCUMENTS

DE 20119700 3/2002
JP 2010262529 A 11/2010

*Primary Examiner* — Ricardo Osorio
(74) *Attorney, Agent, or Firm* — Tarolli, Sundheim, Covell & Tummino LLP

(57) ABSTRACT

A touch-sensitive control element for a vehicle interior comprises a partially transparent decorative part, a functional part and a light source, wherein the functional part is arranged between the decorative part and the light source and comprises a layer of several conductors. The functional part comprises at least one first region and at least one second region, wherein the light transmittance of said at least one second region is less than the light transmittance of said at least one first region.

15 Claims, 3 Drawing Sheets

(56) References Cited

U.S. PATENT DOCUMENTS

2016/0087105 A1\* 3/2016 Sasagawa ......... H01L 21/31144
 438/151
2016/0147337 A1\* 5/2016 Lee ..................... G06F 3/0443
 345/174
2016/0370916 A1\* 12/2016 Hashimoto ........... G06F 3/0446

\* cited by examiner

TOUCH-SENSITIVE OPERATING ELEMENT

RELATED APPLICATION

The present invention claims priority of DE 10 2018 105 927.2, filed on 14 Mar. 2018, the entirety of which is incorporated herein by reference.

FIELD OF THE DISCLOSURE

The disclosure concerns a touch-sensitive operating element for a vehicle interior.

BACKGROUND

Operating elements are usually designed to be touch-sensitive in modern vehicles, thus making it possible to improve the operating comfort on the one hand and to reduce the production costs on the other.

These operating areas usually have backlighting. For this purpose, a light source is provided in the operating element that illuminates the surface of the operating element that is visible from the vehicle interior.

Owing to constructional constraints or other factors, it is not always possible to position the light source in the operating element optimally so that inhomogeneities in the light intensity are recognizable on the user interface of the operating element that is visible to the passenger. The operating element then looks wrong or poorly illuminated.

SUMMARY

It is therefore the object of the disclosure to provide a touch-sensitive operating element in which the operating area facing the vehicle interior is illuminated homogenously.

The object is achieved by means of a touch-sensitive operating element for a vehicle interior comprising a partially transparent decorative part, a functional part and a light source, wherein the functional part is located between the decorative part and the light source and comprises a layer of several conductors. The functional part comprises at least one first region and at least one second region, wherein the light transmittance of said at least one second region is less than the light transmittance of said at least one first region.

As the functional part comprises regions with differing light transmittances, the regions of the decorative part that are illuminated too much by the light source can be darkened by appropriate configuration of the second region. In this way, differences in the illumination of the decorative part and thus in the light intensity on the side of the decorative part facing the vehicle interior can be balanced out until the light intensity is homogenous.

As the regions are created by the necessary functional part in any case, only very slight additional costs are required.

The operating element can be illuminated, for example, by the light source illuminating the decorative part through the functional part.

As a result, the conductors have a lower light transmission or are nontransparent in comparison to the rest of the functional part, with respect to at least the light generated by the light source.

The light source can be a LED or several LEDs.

The light source, in particular the LED(s), is located, for example, only in a part of the second region. The light source, in particular the LED(s), is not provided, for example, all over in the second region or under the second region.

For example, the light source, in particular the LED, is provided in not the first region and/or only the second region. Thus, the light source does not extend, for example, over the entire region of the conductors.

For example, interstices are located between the conductors on the layer, wherein the ratio of the area of the conductors to the area of the interstices of the layer is larger in said at least one second region of the functional part than in said at least one first region of the functional part. Thus, the light transmittance of the second region can be reduced easily as no additional darkening components are required.

The area of the conductors or the interstices is understood to mean the area occupied by the conductors or interstices on the layer. In other words, the ratio is larger, the more the area is occupied by the conductors. Moreover, the light transmittance of the relevant area decreases as the ratio increases.

For example, said at least one first region and said at least one second region are designed and/or located in such a way that the light intensity on the side of the decorative part facing away from the light source is substantially homogenous. In this way, the operating element appears to vehicle occupants to be illuminated uniformly.

The homogeneity of the light intensity is determined in particular via the greater part of the surface or the operating area or via the overall surface or operating area of the decorative part.

In a variant, said at least one second region comprises several subregions, wherein the ratio of the area of the conductors to the area of the interstices differs between the subregions, thus making it possible for complex fluctuations in the intensity to be also balanced.

To improve the homogeneity further, the ratio of the area of the conductors to the area of the interstices can change continuously or successively in said at least one first region and/or said at least one second region.

For example, the ratio of the area of the conductors to the area of the interstices between two of the regions or subregions is thus increased by increasing the width of the conductors and/or decreasing the width of the interstices, thereby not impairing the function of the functional part.

The conductors can be between 25 µm and 200 µm in width. The interstices, i.e. the distance between the conductors, can be between 100 µm and 300 µm in width.

To achieve a particularly uniform light intensity, at least one part of said at least one second region is provided above the light source.

In an embodiment of the disclosure, the conductors are located substantially in a plane that forms the layer. As a result, the functional part can be design flatly.

Substantially in a plane means within the scope of this disclosure that a possible curvature of the functional part and/or the decorative part is disregarded.

Preferably, the functional part comprises a transparent film on which the conductors are applied, thus enabling the functional part to be produced simply.

In a particularly efficient configuration, the conductors extend parallel to each other, the conductors at least partially form a grid, and/or the conductors at least partially form a honeycomb structure.

The functional part may comprise a principal direction, wherein the conductors run in a transverse direction to the principal direction, in a diagonal direction to the principal direction and/or in the principal direction.

To simplify the assembly, the functional part can be attached to the decorative part, in particular adhered to the decorative part.

In an embodiment, the decorative part comprises an operating area for a vehicle occupant in order to facilitate ease of use of the operating element.

Thus, the surface of the decorative part facing away from the functional part can comprise the operating area. For example, the operating area is the section of the surface of the decorative part on which a touch can be recognized or in which the conductor or the layer is provided in the corresponding section of the functional region.

For example, the decorative part is painted or lacquered and/or has been provided with a mark such as a symbol, e.g. by means of laser-beam machining.

To improve the luminous efficacy, the light source can be provided in a cavity of the operating element which is closed on one side by the functional part and/or the operating element can feature a reflector that is provided at least in part between the light source and the functional part.

For example, the side walls of the cavity are at least in part reflective or designed as reflectors.

Preferably, the operating element has a control unit that is electronically connected to the conductors and is configured to recognize a touch on the decorative part. In this way, the ease of use of the operating element is made possible. The touch can occur in particular through the use of a finger.

DESCRIPTION OF THE DRAWINGS

Additional features and advantages of the disclosure can be found in the following description as well as the attached drawings to which reference is made. In the drawings.

DETAILED DESCRIPTION

Figure 1:
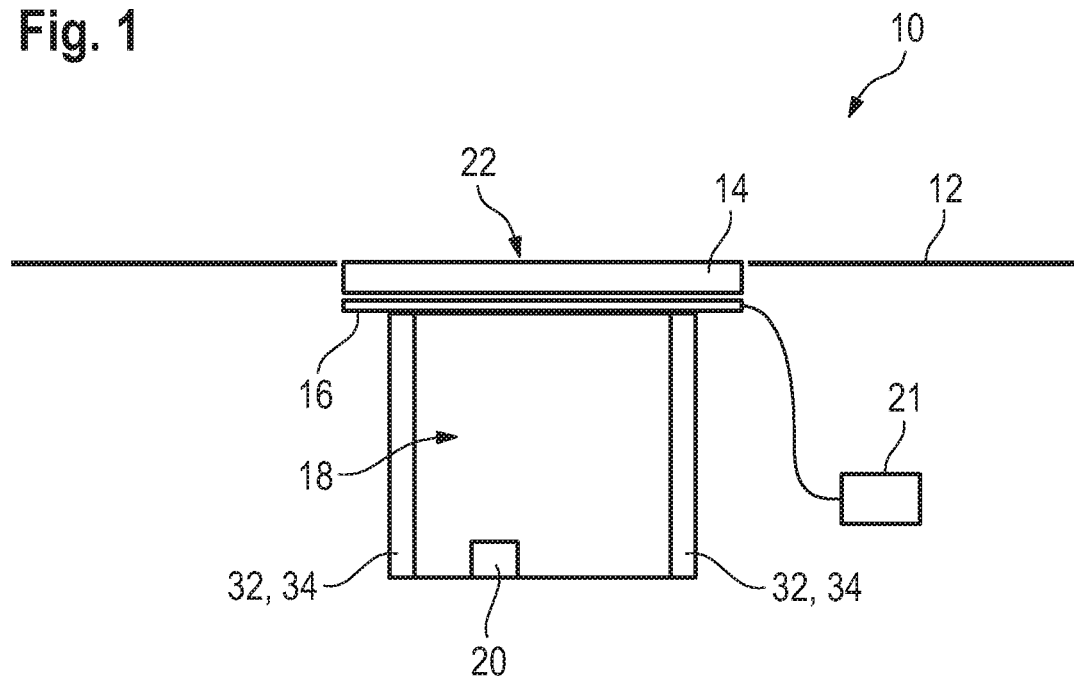
FIG. 1 shows a schematic view of a touch-sensitive operating element according to the disclosure.
Figure 2:
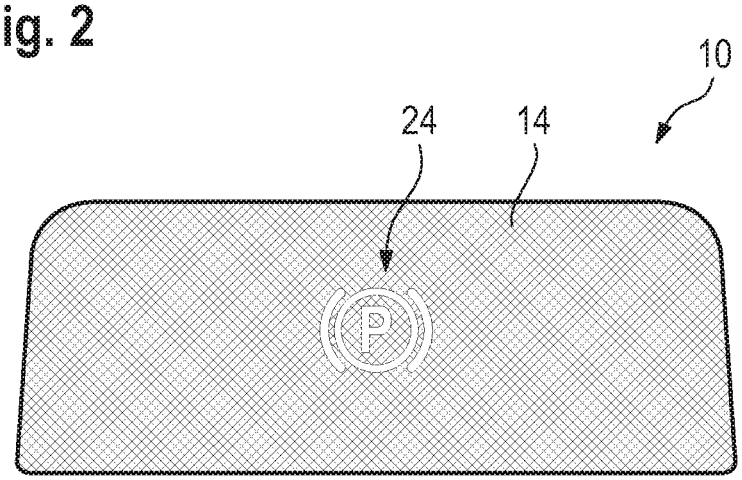
FIG. 2 shows a top view of the operating element according to FIG. 1.

In FIGS. 1 and 2, a touch-sensitive operating element 10 is schematically shown for a vehicle.

The operating element 10 is provided, for example, in a dashboard 12 of a vehicle, i.e. in the vehicle interior.

The operating element 10 allows a passenger in the vehicle interior to operate a certain vehicle function, in the shown example the electric parking brake. However, all other well-known functions of operating elements or buttons are also conceivable, such as the activation of an air conditioning system, the window regulator or the like.

The operating element 10 comprises a decorative part 14, a functional part 16, a cavity 18, a light source 20 and a control unit 21.

The light source 20 is, for example, a LED. The light source 20 emits light with a certain wavelength or a certain known spectrum of wavelengths.

The light source 20 can also comprise a group of LEDs or one or more incandescent light bulbs.

The decorative part 14 forms the cover of the operating element 10 visible to the passenger and, for example, can be flush with the dashboard 12.

The decorative part 14 thus comprises the actual operating area 22 of the operating element 10, i.e. that area that must be touched by the vehicle occupant in order to operate the operating element 10 and actuate the relevant function.

The decorative part 14 is painted or coated with a non-transparent coating in the shown embodiment.

In this regard, when referring to light in general within the scope of this disclosure, this refers to the light emitted by the light source 20 or the corresponding light waves.

The paint or coating is partially removed from the layer of paint or coating, for example by means of a laser, so that a mark, such as a symbol 24, is visible on the decorative part 14. This symbol illustrates the vehicle function allocated to the operating element 10. This is the electric parking brake in FIG. 2.

The symbol 24 is located preferably on the operating area 22 and the decorative part 14 is at least partially transparent in the area of the symbol 24.

The functional part 16 is attached, in particular adhered, to the decorative part 14 on the side of the decorative part 14 facing away from the vehicle interior.

Figure 3:
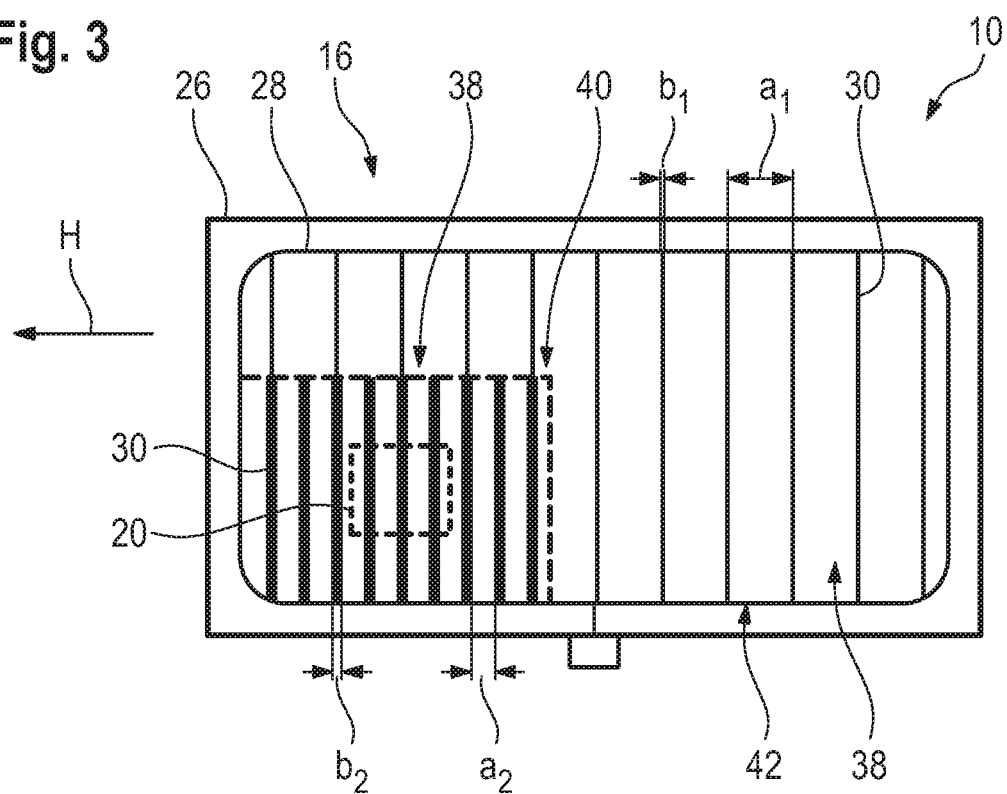
FIG. 3 shows a top view of the operating element according to FIG. 1 with the decorative part removed.

The functional part 16 comprises a transparent film 26 in the shown embodiment and a layer 28 of electrical conductors 30 applied thereto (FIG. 3).

The conductors 30 have a lower light transmission as the film 26 or are nontransparent. For example, they are made of metal.

The cavity 18, in which the light source 20 is provided, is connected to the functional part 16.

The functional part 16 closes the cavity on the side towards the vehicle interior.

The light source 20 is located on the side of the cavity 18 facing away from the vehicle interior.

On this side, the cavity 18 can be opened or closed by a base.

The cavity 18 comprises side walls 32 on which reflectors 34 are provided towards the cavity 18.

In the shown embodiment, the side walls 32 are themselves reflective and thus form the reflectors 34.

In FIG. 3, the operating element 10 is shown in a top view, wherein the decorative part 14 and the side walls 32 are not represented for the sake of clarity.

Therefore, only the functional part 16, more specifically the film 26 and the layer 28 comprising the conductors 30, as well as the light source 20 represented as dashed lines are recognizable.

In FIG. 3, the configuration of the conductors 30 on the layer 28 is easily recognizable.

The conductors 30 are applied, for example vapor-deposited, on the film 26 and are therefore located substantially in a plane that is stretched by the film 26.

As the film 26 is movable, and, if necessary, adapted to a curvature of the decorative part 14 or another contour of the decorative part 14, the plane is also, if necessary, not flat in a geometric sense.

In the shown embodiment, the layer 28 is slightly smaller than the film 26 and thus the decorative part 14. It is however conceivable that the layer 28 is the same size as the film 26 and the decorative part 14.

The layer 28 or the overall functional part 16 is formed substantially rectangularly and therefore has a longitudinal direction that represents a principal direction H. The principal direction H would be the direction of one of the principal axes in the case of a conceivable elliptical embodiment of the functional part 16 or the layer 28.

The conductors 30 of the layer 28 are connected electrically to the control unit 21 of the operating element 10 in order to recognise a touch by a user on the decorative part 14 in a known way.

To this end, the control unit 21 activates the conductors 30 accordingly and measures a change in the measurement values, such as the capacity caused by a touch. If necessary, a further layer of conductors that is connected to the control unit 21 is required for this (not shown).

The operating area 22 thus becomes touch-sensitive through the layer 28 interacting with the control unit 21, i.e. the touch by the user on the operating area 22 with a finger or a suitable input device is recognized.

The operating area 22 thus equals the region of the surface of the decorative part 14 facing the vehicle interior, by providing the layer 28 on the opposite side.

In the first embodiment shown in FIG. 3, the conductors 30 are designed in the layer 28 as straight or conducting paths that run parallel to each other.

The conductors 30 run transversely or perpendicularly to the principal direction H. However, it is conceivable that the conductors 30 run in the principal direction H or parallel to it.

The conductors 30 have a width and are spaced apart from each other, wherein an interstice 38 is provided in each case between the conductors 30. In the interstice 38, the film 26 is primarily transparent, whereas the film 26 and thus the functional part 16 are nontransparent in the regions that are occupied by a conductor 30.

The functional part 16 comprises two different regions, namely a first region 40 and a second region 42. As an illustration, the first and the second regions 40, 42 are shown separated from each other by a dashed line in FIG. 3.

The difference between the two regions 40, 42 is that the conductors 20 and/or the interstices 38 differ in the regions 40, 42.

The conductors 30 have a width $b_1$, and a spacing $a_1$ in the first region 40. The spacing $a_1$ is measured for example from the centerline to the centerline of two adjacent conductors 30.

The conductors 30 have a width $b_2$ and a spacing $a_2$ in the second region 42.

In the first embodiment shown in FIG. 3, the width $b_2$ of the conductors 30 in the second region 42 is larger than the width $b_1$ of the conductors 30 in the first region 40. At the same time, the spacing $a_2$ of the conductors 30 in the second region 42 is smaller than the spacing $a_1$ of the conductors 30 in the first region 40.

However, it is also conceivable that the regions 40, 42 differ from each other only in the width of the conductors 30 or the spacings of the conductors 30.

For example, the width $b_1$ of the conductors 30 in the first region 40 is between 25 µm and 200 µm, in particular at 50 µm. The spacing $a_1$ of the conductors 30 in the first region 40 is between 100 µm and 200 µm, in particular at 150 µm.

In contrast, the width $b_2$ of the conductors 30 of the second region 42 is between 100 µm and 200 µm, in particular at 150 µm, and/or the spacing $a_2$ of the conductors 30 of the second region 42 is between 200 µm and 300 µm, in particular at 250 µm Owing to the larger width of the conductors 30 and the smaller width of the interstices 38 which depends on the width of the conductors 30 and the spacing of the conductors, the ratio of the area of the conductors 30 to the area of the interstices 38 in the second region 42 is larger than this ratio in the first region 40.

In this regard, the area of the conductors 30 or the interstices 38 is understood to mean the area occupied by the conductors 30 or the interstices 38 on the film 26. The ratio results from the area of the conductors 30 divided by the area of the interstices 38.

In other words, the ratio is larger, the more area is occupied by the nontransparent conductors 30 on the film 26. Thus, the light transmittance in the second region 42 is less than in the first region 40.

As can be seen in FIG. 3 and also in FIG. 1, the second region 42 is provided at least in part above the light source 20 and the remaining region of the film 26 forms the first region 40.

In this regard, above means for example that an imaginary line from the light source 20 runs perpendicular to the decorative part 14 through the second region 42.

The light source can be a LED or several LEDs.

The light source 20 is only located, for example, in a part of the second region 42 or below the second region 42. The light source 20 is not provided in particular all over the second region 42 or under the second region 42.

For example, the light source 20 is not provided in the first region 40 and/or the light source 20 is only provided in the second region 42. Thus, the light source 40 does not extend, for example, over the entire region of the conductors 30.

During the operation of the light source 20, the light emitted by the light source 20 illuminates the decorative part 14 through the functional part 16

To this end, owing to the differing regions 40, 42, the light transmittance of the functional part 16 is thus adapted to the light source 20, its layer and/or the embodiment of the cavity 18 and the reflectors 34 so that the light intensity that is viewed on the operating area 22 from the vehicle interior or that exists on the entire decorative part 14 is substantially homogenous over the operating area 22 and the entire decorative part 14. The regions 40, 42 comprising different light transmittances of the functional part 16, i.e. the layer and its respective light transmission, are selected accordingly.

In this way, a consistent illumination of the decorative part 14 and the marks, in particular the symbol 24, is achieved.

Figure 4:
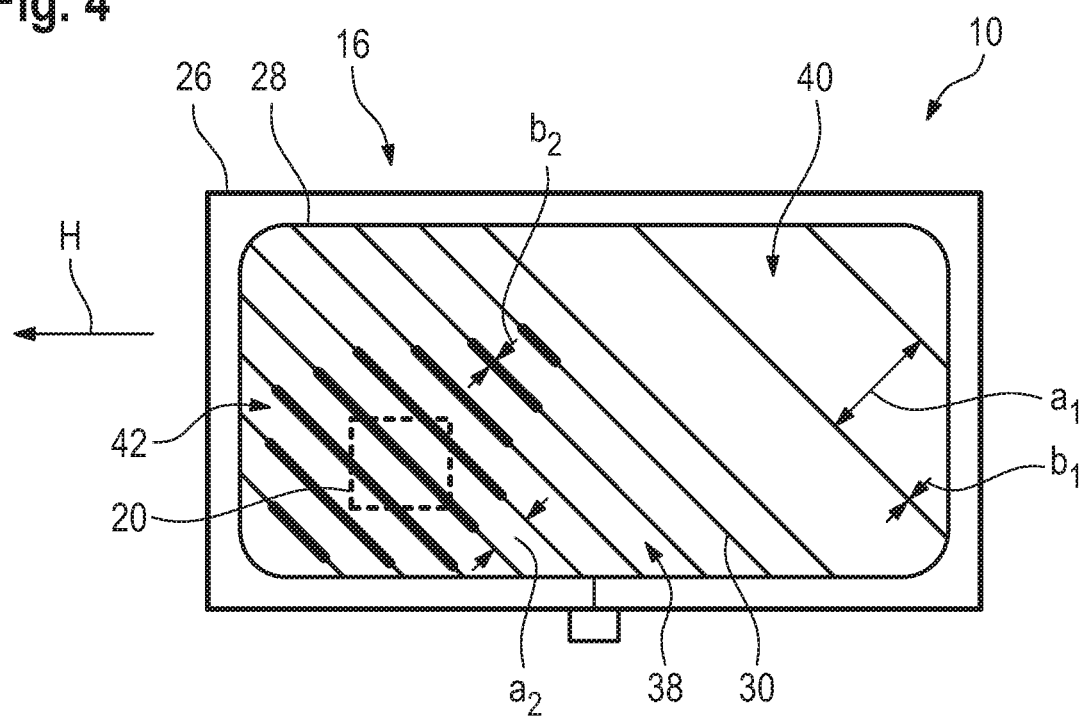
FIG. 4 shows a second embodiment of a touch-sensitive operating element according to the disclosure in a top view similar to the one in FIG. 3.
Figure 5:
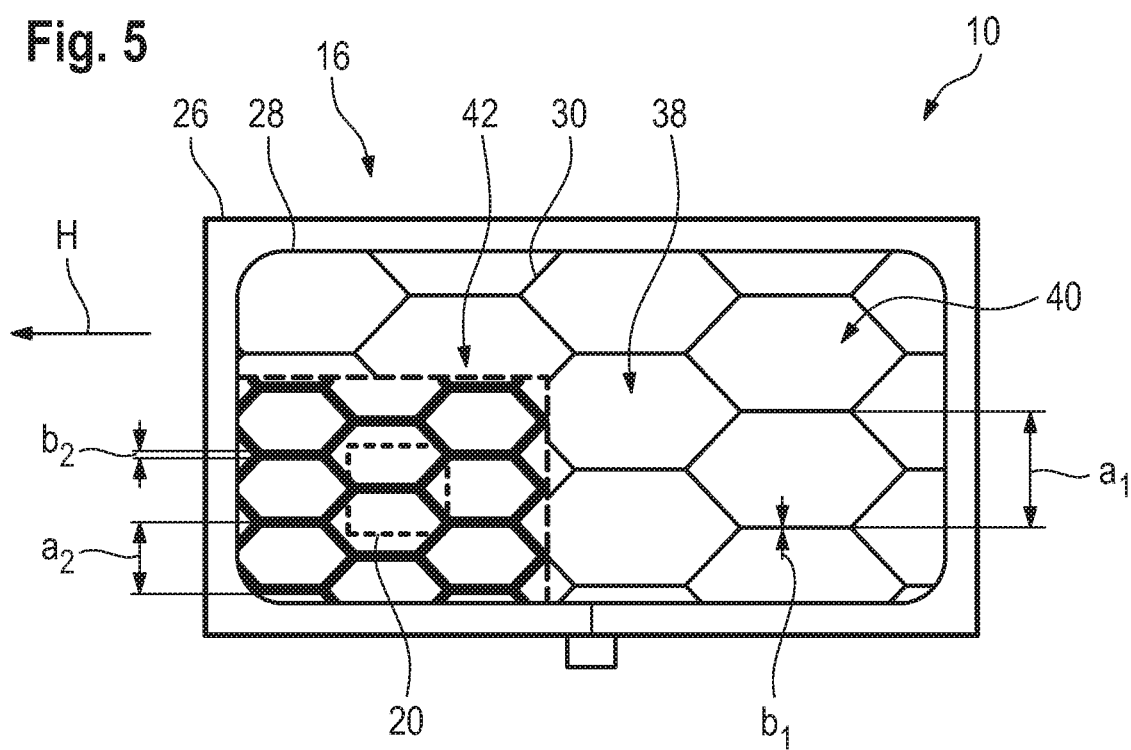
FIG. 5 shows a third embodiment of a touch-sensitive operating element according to the disclosure in a top view similar to that of FIG. 3.
Figure 6:
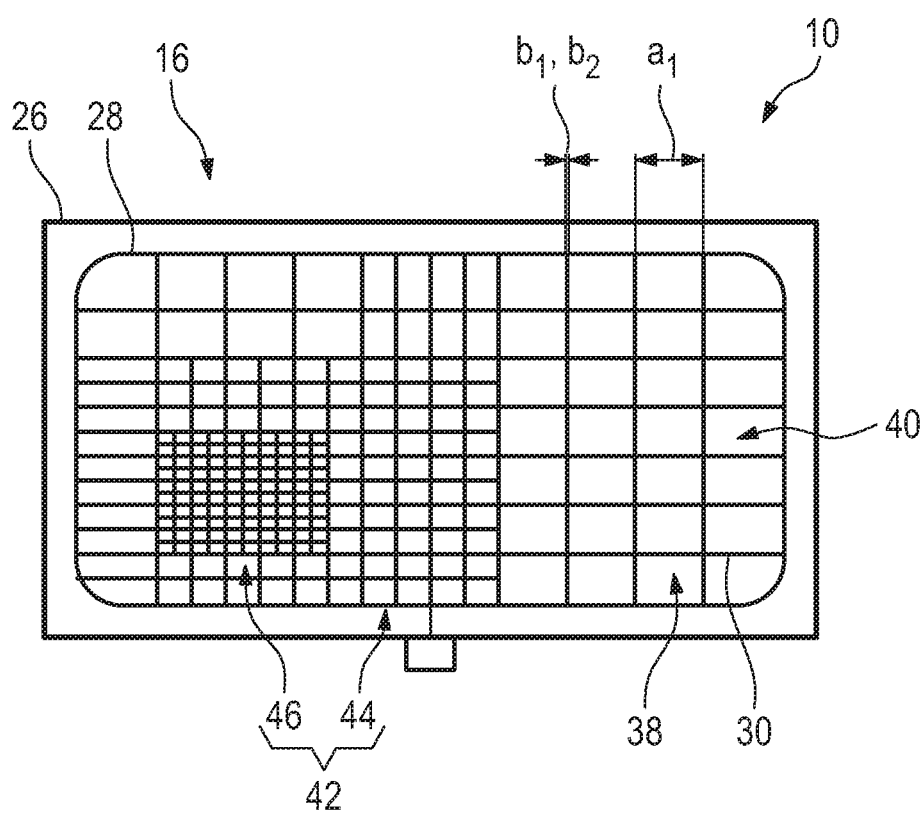
FIG. 6 shows a fourth embodiment of a touch-sensitive operating element according to the disclosure in a top view similar to that of FIG. 3.

In FIGS. 4, 5 and 6, further embodiments of the disclosure are shown which substantially correspond to the first embodiment of the FIGS. 1 to 3. Therefore, only the differences are discussed hereinafter and the same parts and parts with the same function are provided with the same reference signs.

The conductors run diagonally to the principal direction H in the second embodiment shown in FIG. 4.

Moreover, in contrast to the first embodiment, an abrupt leap in the width $b_1$ and in the spacing $a_1$ does not occur from the first region 40 to the width $b_2$ or the spacing $a_2$ of the second region 42, but rather the transition from the first region 40 to the second region 42 occurs successively or continuously.

Thus, the ratio of the area of the conductors 30 to the area of the interstices 38 changes continuously or successively.

The first region 40 and the second region 42 transition into each other in this case.

A third embodiment is shown in FIG. 5, wherein in contrast to the first embodiment, the conductors 30 do not run parallel in this embodiment, but rather form a honeycomb structure.

As in the first embodiment, the conductors 30 are thinner and the spacings $a_1$ are larger in the first region so that larger honeycombs of the honeycomb structure are formed.

The honeycombs of the honeycomb structure are therefore smaller in the second region 42.

In the fourth embodiment shown in FIG. 6, the conductors 30 run perpendicular to each other and form a grid.

Moreover, the second region 42 comprises a first subregion 44 and a second subregion 46, wherein the first subregion 44 surrounds the second subregion 46.

The ratio of the area of the conductors 30 to the area of the interstices 38 is larger in the second subregion 46 than in the first subregion 44. In comparison to the first region 40, the ratio of the area of the conductors 30 to the area of the interstices 38 is larger in both subregions 44, 46.

This is achieved in the fourth embodiment by changing the spacings between the conductors 30 so that the grid is denser, or rather the grid points are closer together in the second subregion 46 as in the first subregion 44.

Of course, features of the various shown embodiments can be combined with each other as desired. Thus, for example, a gradual transition is easily possible between the regions 40, 44, 46 in the fourth embodiment It is also conceivable that different configurations of the conductors 30 are used in different regions 40, 42. For example, the conductors 30 can run in the principal direction H in the first region and diagonally to this in the second region 42 or form a gird or honeycomb form.

The invention claimed is:

1. Touch-sensitive operating element for a vehicle interior comprising a partially transparent decorative part, a functional part and a light source, wherein the functional part is located between the decorative part and the light source and comprises a layer of several conductors, wherein the functional part comprises at least one first region and at least one second region, wherein a ratio of an area of the conductors to an area of interstices between the conductors is larger in each second region compared to each first region such that the light transmittance of said at least one second region is less than the light transmittance of said at least one first region such that the light intensity on the side of the decorative part facing away from the light source is homogenous.

2. Operating element according to claim 1, wherein said at least one second region comprises several subregions (44, 46), wherein the ratio of the area of the conductors to the area of the interstices differs between the subregions (44, 46).

3. Operating element according to claim 1, wherein the ratio of the area of the conductors to the area of the interstices changes continuously or successively in at least one of said at least one first region and said at least one second region.

4. Operating element according to claim 1, wherein the ratio of the area of the conductors to the area of the interstices between two of the regions (40, 42) or subregions (44, 46) is increased by at least one of increasing the width ($b_2$) of the conductors and decreasing the width of the interstices.

5. Operating element according to claim 1, wherein at least one part of said at least one second region is provided above the light source.

6. Operating element according to claim 1, wherein the conductors are located substantially in a plane that forms the layer.

7. Operating element according to claim 1, wherein the functional part comprises a transparent film on which the conductors are applied.

8. Operating element according to claim 1, wherein at least one of: the conductors extend parallel to each other; the conductors at least partially form a grid; and the conductors at least partially form a honeycomb structure.

9. Operating element according to claim 1, wherein the functional part can comprise a principal direction (H), wherein the conductors run at least one of in a transverse direction to the principal direction (H), in a diagonal direction to the principal direction (H) and in the principal direction (H).

10. Operating element according to claim 1, wherein the functional part is attached to the decorative part.

11. Operating element according to claim 10, wherein the functional part is adhered to the decorative part.

12. Operating element according to claim 1, wherein the decorative part comprises an operating area for a vehicle occupant.

13. Operating element according to claim 1, wherein the light source is provided in a cavity of the operating element which is closed on one side by the functional part.

14. Operating element according to claim 1, wherein the operating element comprises a reflector that is provided at least in part between the light source and the functional part.

15. Operating element according to claim 1, wherein the operating element comprises a control unit that is electronically connected to the conductors and is configured to recognize a touch on the decorative part.

\* \* \* \* \*